United States Patent
Meunier-Beillard et al.

(10) Patent No.: US 8,431,966 B2
(45) Date of Patent: Apr. 30, 2013

(54) METHOD OF MANUFACTURING A BIPOLAR TRANSISTOR SEMICONDUCTOR DEVICE AND SEMICONDUCTOR DEVICES OBTAINED THEREBY

(75) Inventors: Philippe Meunier-Beillard, Kortenberg (BE); Erwin Hijzen, Haasrode (BE); Johannes J. T. M. Donkers, Valkenswaard (NL)

(73) Assignee: NXP B.V., Eindhoven (NL)

(*) Notice: Subject to any disclaimer, the term of this patent is extended or adjusted under 35 U.S.C. 154(b) by 49 days.

(21) Appl. No.: 12/994,113

(22) PCT Filed: May 11, 2009

(86) PCT No.: PCT/IB2009/051931
§ 371 (c)(1),
(2), (4) Date: Jun. 9, 2011

(87) PCT Pub. No.: WO2009/141753
PCT Pub. Date: Nov. 26, 2009

(65) Prior Publication Data
US 2011/0304019 A1    Dec. 15, 2011

(30) Foreign Application Priority Data
May 21, 2008   (EP) .................... 08104047

(51) Int. Cl.
*H01L 21/33*   (2006.01)
*H01L 29/732*  (2006.01)
(52) U.S. Cl.
USPC ...... 257/197; 257/E21.37; 438/324; 438/341; 438/343; 438/349; 438/364

(58) Field of Classification Search ............... 438/334, 438/341, 343, 349, 364; 257/E21.37, 197
See application file for complete search history.

(56) References Cited

U.S. PATENT DOCUMENTS
6,713,361 B2 * 3/2004 Nawaz et al. ............. 438/309
6,784,063 B2 * 8/2004 Cha ............................ 438/314
(Continued)

FOREIGN PATENT DOCUMENTS
WO   2005088721 A   9/2005
WO   2007057803 A1  5/2007
WO   2007105155 A1  9/2007

OTHER PUBLICATIONS

Borel, et al; "Control of Selectivity Between SiGe and SI in Isotropic Etching Processes" L Japanese Journal of Applied Physics, vol. 43, No. 6B; pp. 3964-3966 (2004).
(Continued)

*Primary Examiner* — George Fourson, III

(57) ABSTRACT

Methods for manufacturing a bipolar transistor semiconductor device are described, along with devices fabricated in accordance with the methods. The methods include the steps of forming a stack of layers over a semiconductor body comprising a window definition layer (18,38), a layer (20) of semiconductor material, a first insulating layer (22), and a second insulating layer (24) which is selectively etchable with respect to the first insulating layer. A trench (26) is then etched into the stack down to the window definition layer. The portion of the trench extending through the second insulating layer is widened to form a wider trench portion (28) therethrough. A window (36) is defined in the window definition layer which is aligned with the wider trench portion, and serves to define the base-collector or base-emitter junction in the finished device.

15 Claims, 17 Drawing Sheets

U.S. PATENT DOCUMENTS

| | | | |
|---|---|---|---|
| 6,867,105 B2 * | 3/2005 | Stengl et al. | 438/320 |
| 7,037,798 B2 * | 5/2006 | Adam et al. | 438/312 |
| 7,060,590 B2 | 6/2006 | Bressot et al. | |
| 7,067,396 B2 | 6/2006 | Aspar et al. | |
| 7,074,685 B2 | 7/2006 | Magnee et al. | |
| 7,151,035 B2 * | 12/2006 | Koshimizu et al. | 438/309 |
| 7,229,899 B2 | 6/2007 | Moriceau et al. | |
| 7,341,920 B2 * | 3/2008 | Khater | 438/364 |
| 7,615,457 B2 * | 11/2009 | Akatsu et al. | 438/366 |
| 7,696,034 B2 * | 4/2010 | Geiss et al. | 438/202 |
| 8,048,734 B2 * | 11/2011 | Wilhelm | 438/234 |
| 2002/0192894 A1 | 12/2002 | Kalnitsky et al. | |
| 2005/0233535 A1 * | 10/2005 | Freeman et al. | 438/349 |
| 2007/0126080 A1 | 6/2007 | Wallner et al. | |
| 2008/0261371 A1 * | 10/2008 | Ho et al. | 438/311 |
| 2009/0166753 A1 | 7/2009 | Hijzen et al. | |
| 2010/0068863 A1 | 3/2010 | Hijzen | |
| 2011/0062548 A1 * | 3/2011 | Feilchenfeld et al. | 257/517 |
| 2012/0228611 A1 * | 9/2012 | Chan et al. | 257/51 |

OTHER PUBLICATIONS

Aspar, et al; "IC's Performance Improvement and 3D Integration by Layer Transfer Technologies"; 2006 IEEE Int'l SOI Conference Proceedings (2006).

Moriceau, et al; "Transfer of Patterned Si and SiO2 Layers for the Fabrication of Patterned and Maixed SOI"; The Proceedings of the 2004 IEEE Int'l SOI Conference (2004).

International Search Report and Written Opinion for Application PCT/IB2009/051931 (Aug. 27, 2009).

* cited by examiner

US 8,431,966 B2

METHOD OF MANUFACTURING A BIPOLAR TRANSISTOR SEMICONDUCTOR DEVICE AND SEMICONDUCTOR DEVICES OBTAINED THEREBY

The present invention relates to methods for manufacturing semiconductor devices, and more particularly to methods for manufacturing bipolar transistor semiconductor devices.

There is an ongoing need to achieve higher data rates in RF semiconductor device applications making increases in carrier frequency desirable. This pushes the required cut-off frequency of RF technologies to higher values. Important RF figures-of-merit are the maximum frequencies for the current, power and voltage gain of a device, referred to as $f_T$, $f_{MAX}$, and $f_A$, respectively. The extrinsic collector-base capacitance has a significant influence on $f_T$ and $f_{MAX}$ of the device. Therefore, minimization of this parameter can have a substantial impact on the operation speed of the device.

Self-alignment of features of a device may assist in reducing parasitic capacitances. For example, WO 2007/144828 discloses a method for fabricating a bipolar transistor with a self-aligned collector-extrinsic base junction.

The present invention provides a method of manufacturing a bipolar transistor semiconductor device having an emitter region, a base region and a collector region, including the steps of:

providing a first semiconductor region of a first conductivity type in a semiconductor body which forms one of the collector and emitter regions;

forming a stack of layers over the semiconductor body comprising a window definition layer, a layer of semiconductor material of a second, opposite conductivity type, a first insulating layer, and a second insulating layer selectively etchable with respect to the first insulating layer; and etching a trench into the stack at least down to the window definition layer, wherein a window is defined in the window definition layer which is aligned with the trench portion through the second insulating layer, and defines the base-collector or base-emitter junction in the finished device.

According to methods embodying the present invention, a bipolar transistor may be fabricated in which the emitter-extrinsic base spacing, intrinsic base-extrinsic base connection, and the collector-intrinsic base junction are all self-aligned to the emitter and can be adjusted independently. This provides the designer with freedom for example to make the emitter-base and base-collector junction areas the same. Furthermore, it allows a device to be fabricated either as a so-called collector-up device, or as an emitter-up device.

In accordance with embodiments of the invention, different layers in the stack of layers are etched to define extrinsic components of the bipolar transistor. Lateral etches centered around the first trench provide self-alignment.

The window in the window definition layer may define the base-collector or base-emitter junction in the finished device either directly, or indirectly in that the junction width is dependent on the width of the window.

In some embodiments, the window may be defined in the window definition layer by the trench etching step, during which a trench is etched through the stack and including the window definition layer to form the window in that layer. Alternatively, after etching an initial trench into the stack at least down to the window definition layer, a further etching process may be carried out so as to widen the portion of the initial trench which extends through the second insulating layer to form a wider trench portion in that layer. In accordance with this approach, the window in the window definition layer is aligned with the wider trench portion through the second insulating layer.

Preferably, the manufacturing method includes a step of annealing such that material from the layer of semiconductor material is reshaped so as to extend into the window. A deposition process may be carried out instead of, or in combination with, the annealing process so as to fill the window with semiconductor material. Deposition by selective epitaxial growth is preferred. In doing so, a junction is formed with the semiconductor body and may merge with the material of the substrate.

In a preferred embodiment, the method includes a step of etching the first insulating layer back from the first trench; and depositing a non-conformal layer of insulating material, which is selectively etchable with respect to the second insulating layer, to form a region of insulating material on the layer of semiconductor material which is aligned with the wider trench portion. In this way, the first insulating layer is laterally etched to define the extent of the extrinsic base in a self-aligned manner.

Semiconductor material may then be selectively epitaxially grown on the areas of the layer of semiconductor material which are exposed on either side of the aligned material to form the base region of the device. Alternatively, semiconductor material may be non-selectively epitaxially grown over the exposed surfaces of the device, a portion of which material ultimately forms part of the base region of the device.

Later in the manufacturing process, the method may include a step of depositing semiconductor material of the first conductivity type in the trench portion through the second insulating layer so as to contact the base region and ultimately form one of the emitter and collector regions, with the location of the emitter-base or collector-base junction respectively being dependent on the location and width of the trench portion. Optionally, the width of the trench portion may be increased prior to this step by etching away material of the second insulating layer. Alternatively, the width of the trench portion may effectively be reduced by forming spacers on its sidewalls. Increasing the width of the trench portion may be preferable where non-selective epitaxial growth is used as described above in the formation of the base region.

In a preferred embodiment, the window definition layer is formed of epitaxially deposited semiconductor material, the layer of semiconductor material is epitaxially deposited thereon, with the material of the window definition layer being selectively etchable with respect to the layer of semiconductor material, and the step of defining a window in the window definition layer comprises the steps of:

etching back the window definition layer from the walls of the trench;

conformally depositing window definition insulating material etchable simultaneously with the material of the first insulating layer; and anisotropically etching away the window definition insulating material and material of the first insulating layer using the second insulating layer as a mask, so as to form the window in the window definition layer. In this way, the window definition layer is laterally etched and replaced with insulating material so as to form a local isolation structure which is self-aligned to the wider trench portion.

In accordance with a further embodiment, the window definition layer is formed of insulating material, and the layer of semiconductor material is provided thereover by bonding a separate semiconductor substrate onto the insulating layer, and separating the layer of semiconductor material from the remainder of the separate semiconductor substrate. The window may be defined in the window definition layer then by etching away material from that layer using the wider trench portion in the second insulating layer as a mask.

The present invention further provides a semiconductor device obtained by a method as described herein. In a preferred embodiment, the window definition layer is formed of insulating material, and the layer of semiconductor material is substantially monocrystalline and extends over the window definition layer and through the window to contact the collector or emitter region in the semiconductor body.

The methods described herein are suitable for making semiconductor devices comprising a bipolar transistor, such as a discrete bipolar transistor device. It is also applicable to the manufacture of integrated circuits comprising a bipolar transistor such as Bi(C)MOS "bipolar (complimentary) metal oxide semiconductor" integrated circuits.

Embodiments of the invention will now be described by way of example and with reference to the accompanying schematic drawings, wherein.

Figure 1:
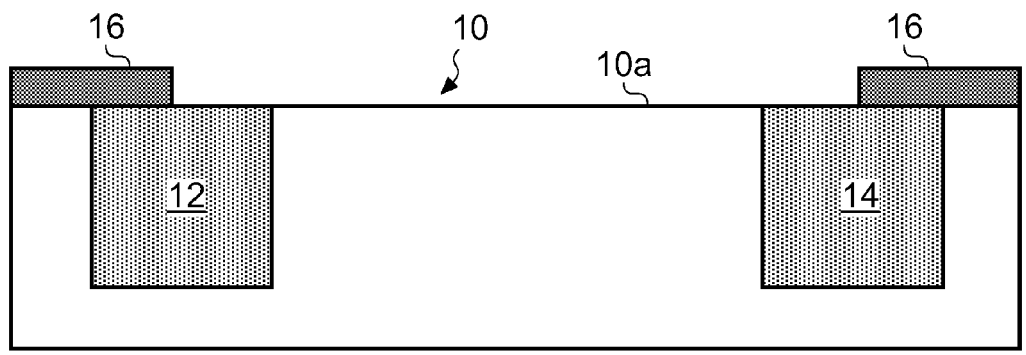
FIGS. 1 to 14 are cross-sectional side views of a semiconductor substrate during successive stages in the fabrication of a bipolar transistor in accordance with an embodiment of the invention.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar features in modified and different embodiments.

FIGS. 1 to 14 illustrate successive stages in a process for manufacturing a bipolar transistor device embodying the present invention. The process is described to form a vertical NPN transistor, although it will be readily appreciated that a PNP transistor could be formed by reversing the conductivity types.

FIG. 1 shows a portion of an n-type semiconductor substrate forming a silicon semiconductor body 10. A buried layer may be provided in the body which is more highly doped n-type than the remainder of the body to form a connection to the collector in the finished device. A device isolation structure is provided in the form of STI ("Shallow Translation Isolation") regions 12 and 14 formed of silicon dioxide. Regions 12 and 14 extend to the top major surface 10a of the semiconductor body. A layer of silicon nitride is deposited on the top major surface 10a of the silicon body and patterned to form a CMOS protect layer 16 which defines the bipolar device regions (layer 16 may be 20 nm thick for example).

Figure 2:
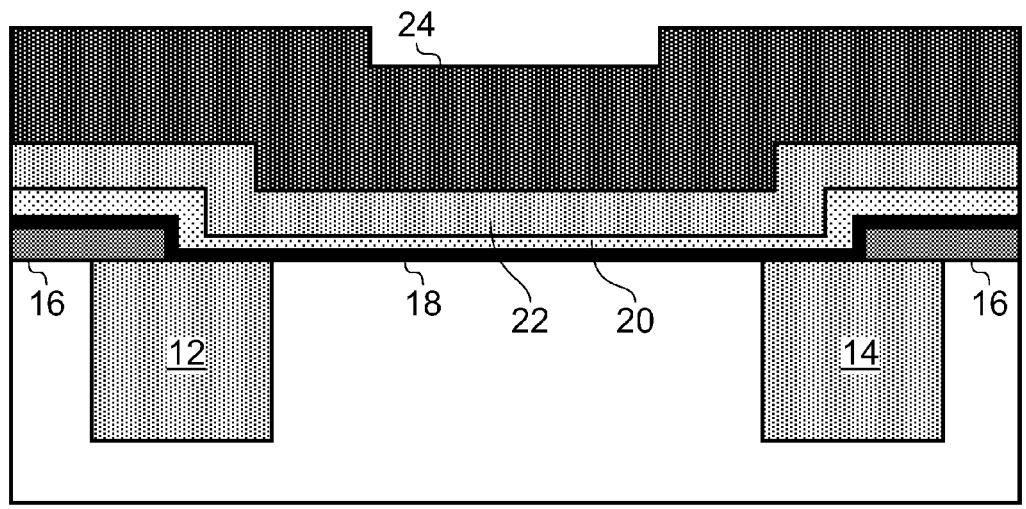

As shown in FIG. 2, a stack of layers is then formed over the semiconductor body, namely an epitaxially SiGe layer 18 around 15 nm thick (for example with around Ge 25 at. %); an epitaxial layer 20 of monocrystalline silicon around 5 to 50 nm; a silicon dioxide layer 22 around 40 nm thick; and a silicon nitride layer 24, around 180 nm thick.

Figure 3:
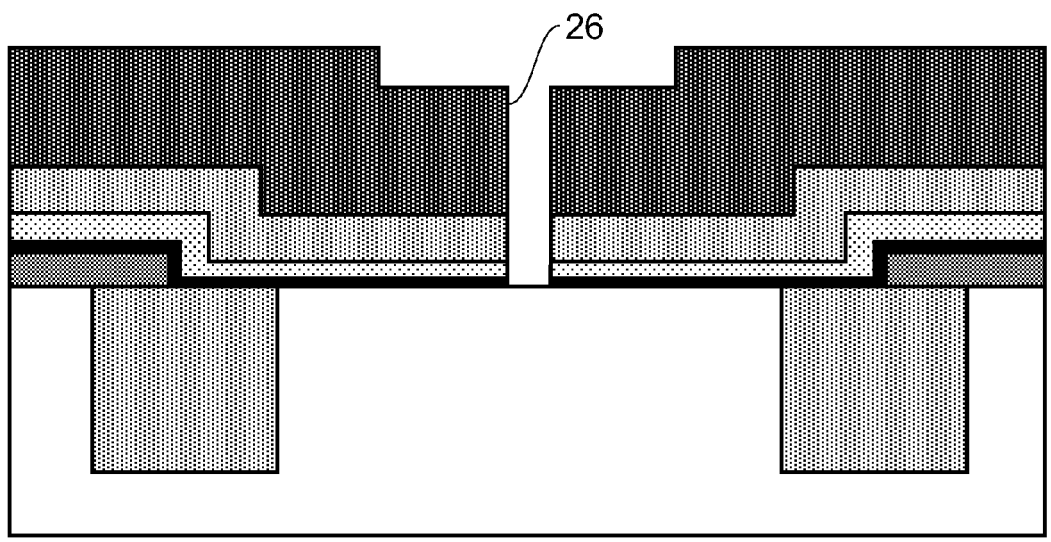
Figure 4:
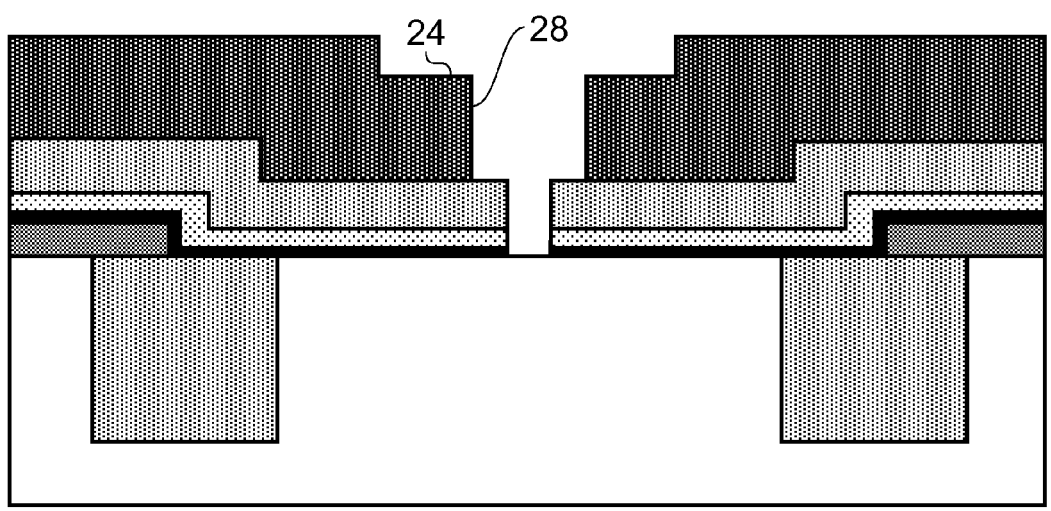

Subsequently, as shown in FIG. 3, a trench 26 is formed in the layer structure by means of photolithography and etching, stopping on the SiGe layer 18. As shown in FIG. 4, the portion of this trench which extends through nitride layer 24 is then widened to form a wider, second trench portion 28 therethrough. This may be formed by isotropically etching away the exposed surface of the silicon nitride layer, reducing its thickness by around 30 nm.

Figure 5:
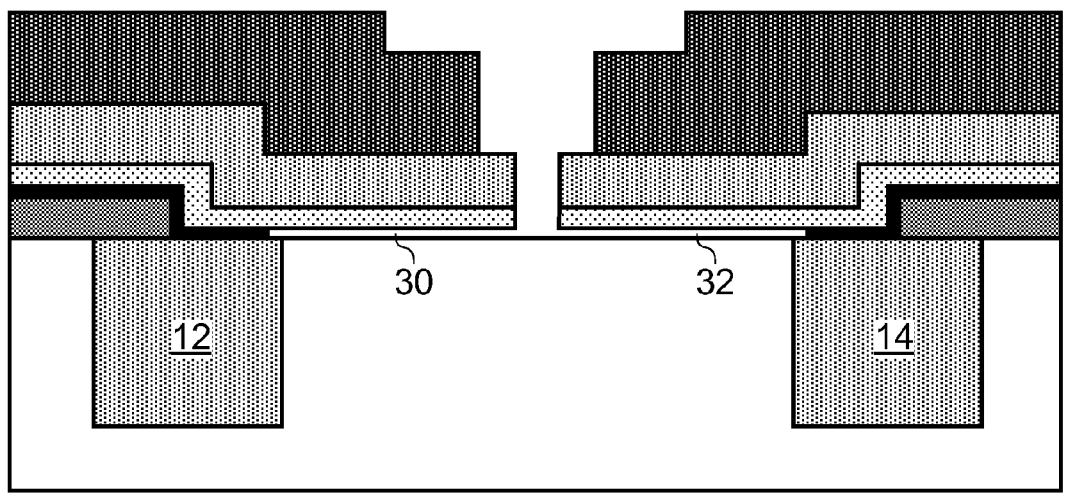

Next, a further etch process is carried out to laterally etch away material from SiGe layer 18, to beyond the inner edges of STI regions 12 and 14. This SiGe etch is selective to silicon, oxide and nitride and may be based for example on a $CF_4$ mixed with $O_2$ chemistry. A suitable example is disclosed in "Control of selectivity between SiGe and SI in isotropic etching processes" by Borel et al, Japanese Journal of Applied Physics, Vol. 43, No. 6B, 2004, pp. 3964-3966, the contents of which are incorporated herein by reference. This forms lateral trenches 30 and 32 as shown in FIG. 5.

Figure 6:
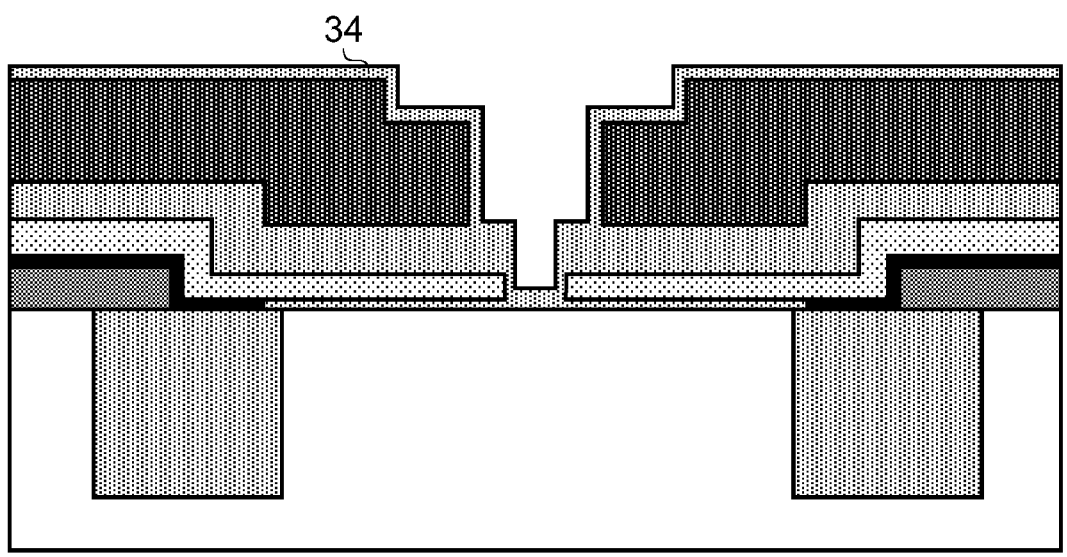
Figure 7:
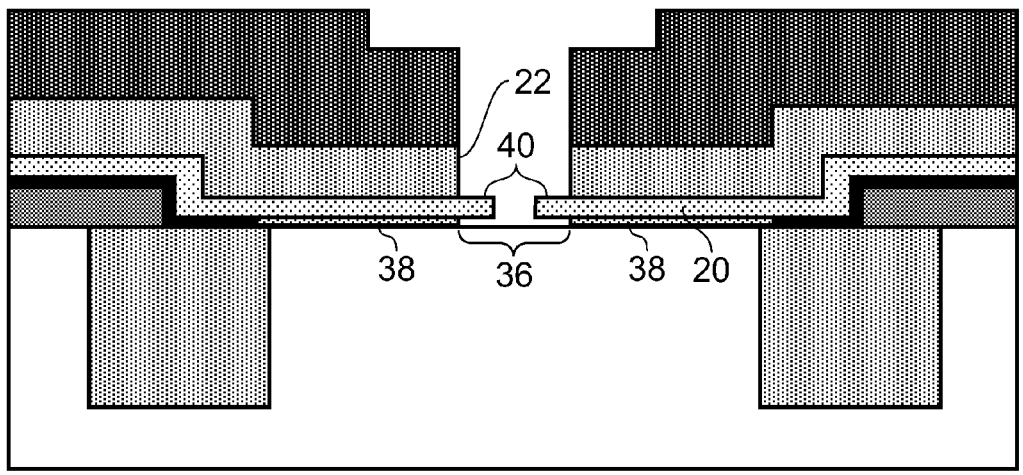

An oxide layer 34 is deposited conformally and fills the lateral trenches 30, 32 as illustrated in FIG. 6. The oxide material is then etched away anisotropically in a manner selective to silicon. The nitride layer 24 acts as a mask so that a window 36 is defined in the oxide layers 22 and 38 over the semiconductor body. As shown in FIG. 7, this exposes portions 40 of silicon layer 20 which extend partially over window 36.

Figure 8:
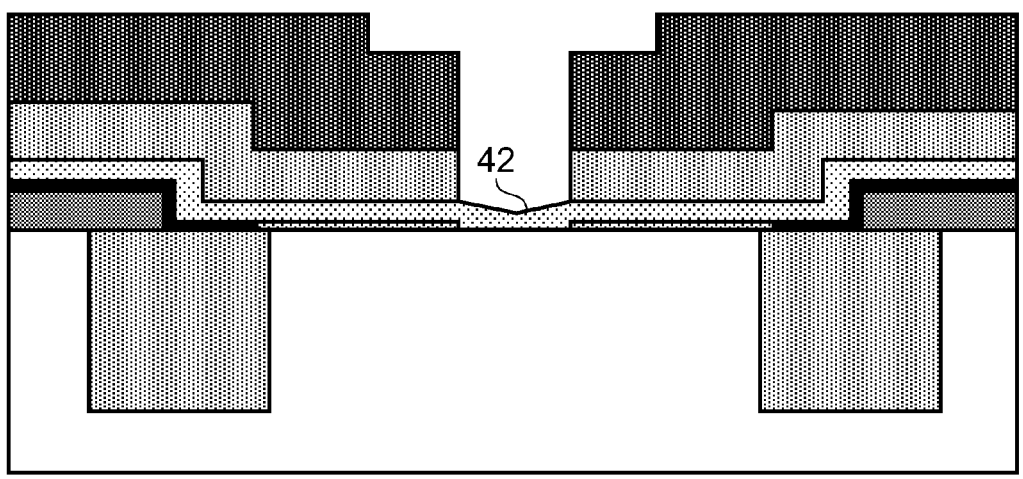

A hydrogen anneal process is carried out so as to reshape portions 40, filling window 36 and merging them with the semiconductor body 10 in region 42 (see FIG. 8). Deposition of semiconductor material may be performed instead of or in combination with the anneal process to fill the window with semiconductor material. Deposition by selective epitaxial growth is preferred.

Figure 9:
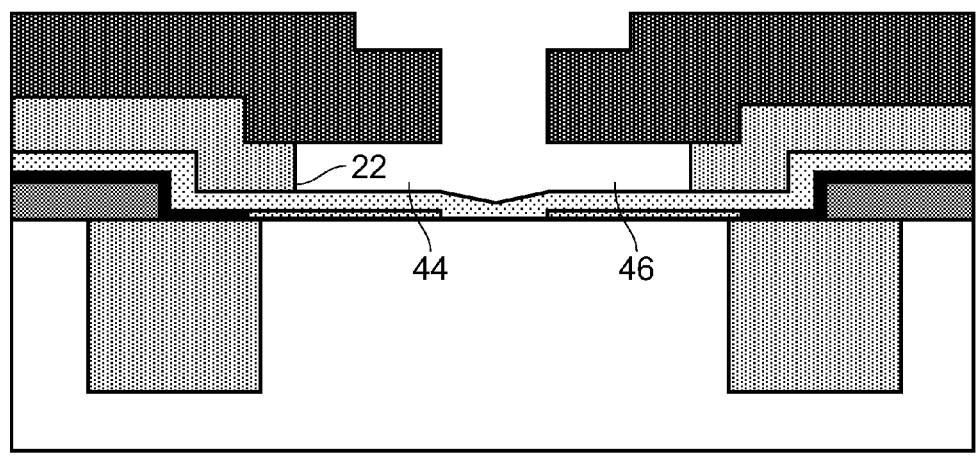
Figure 10:
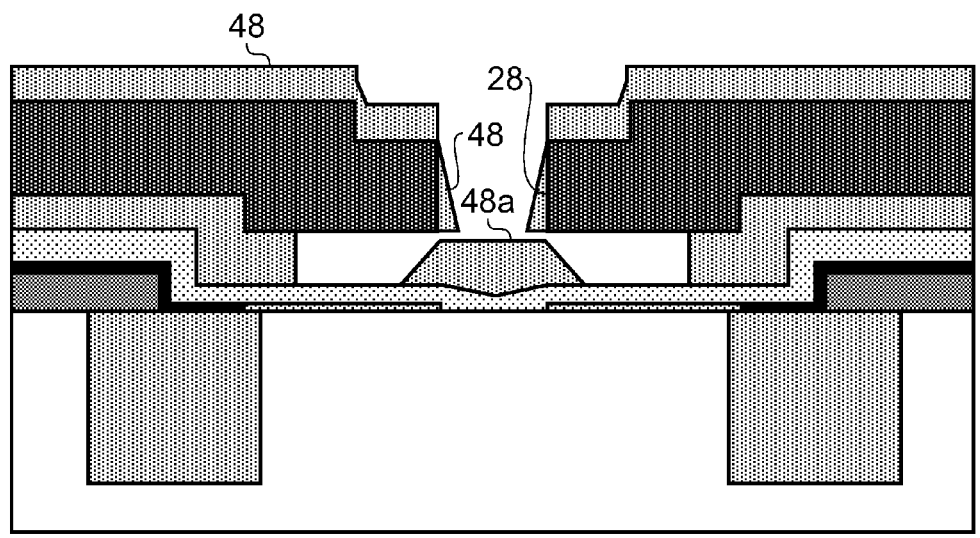
Figure 11:
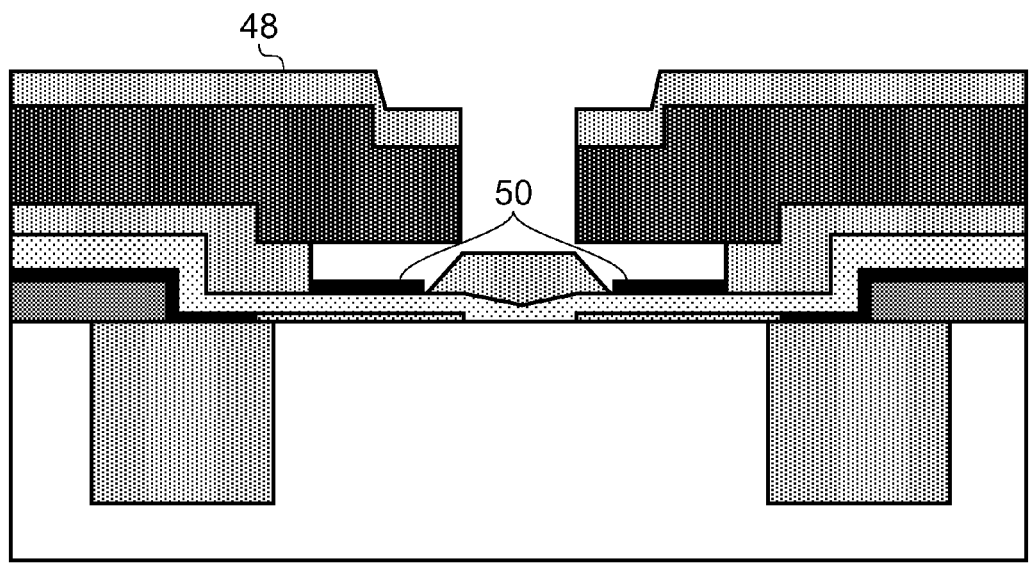

Next, oxide layer 22 is etched back laterally, forming lateral trenches 44 and 46 as shown in FIG. 9.

Figure 12:
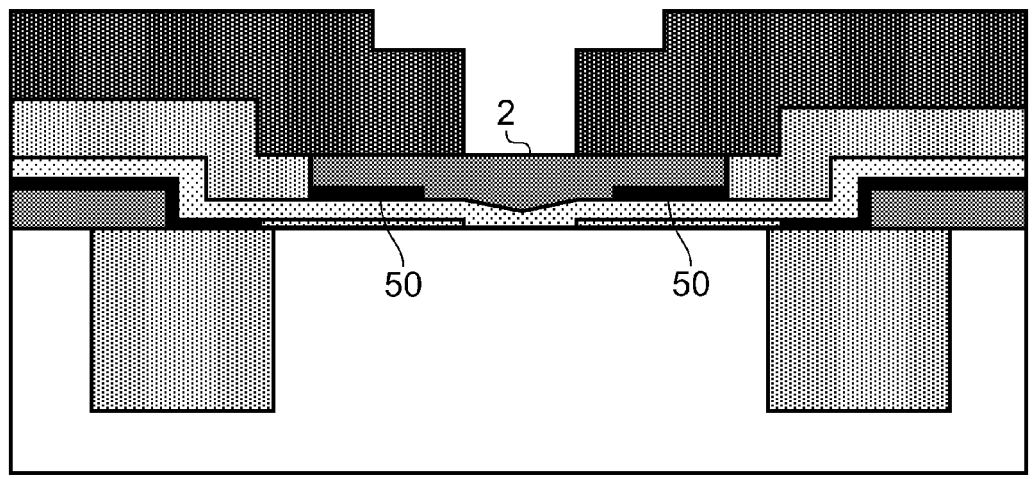

A plasma oxide deposition process is then carried out to form oxide layer 48, as schematically depicted in FIG. 12. This layer includes a region 48a on semiconductor layer 20, which is aligned with trench portion 28 through nitride layer 24. A short oxide etch process is then carried out, which removes the oxide material from the walls of trench 28, and reduces the lateral and vertical dimensions of oxide region 48a (see FIG. 11). Silicon doped with boron is selectively epitaxially grown on exposed surfaces of silicon layer 20 to form Si:B regions 50, which may be around 10 nm thick, for example, and have a boron concentration of the order of 1E20 or 1E21 atoms/$cm^3$.

The Si:B layer 50 serves to define the extent of the extrinsic base of the device. Oxide layer 48, 48a is then etched away and then silicon is epitaxially grown on Si:B layer 50 and the exposed surface of silicon layer 20 to form base region 2. The grown region of the base may for example consist of 10 nm of SiGeC, followed by 5 nm SiGeC:B, 5 nm SiGeC and 10 nm of silicon (doped or undoped). The resulting structure is shown in FIG. 12.

Figure 13:
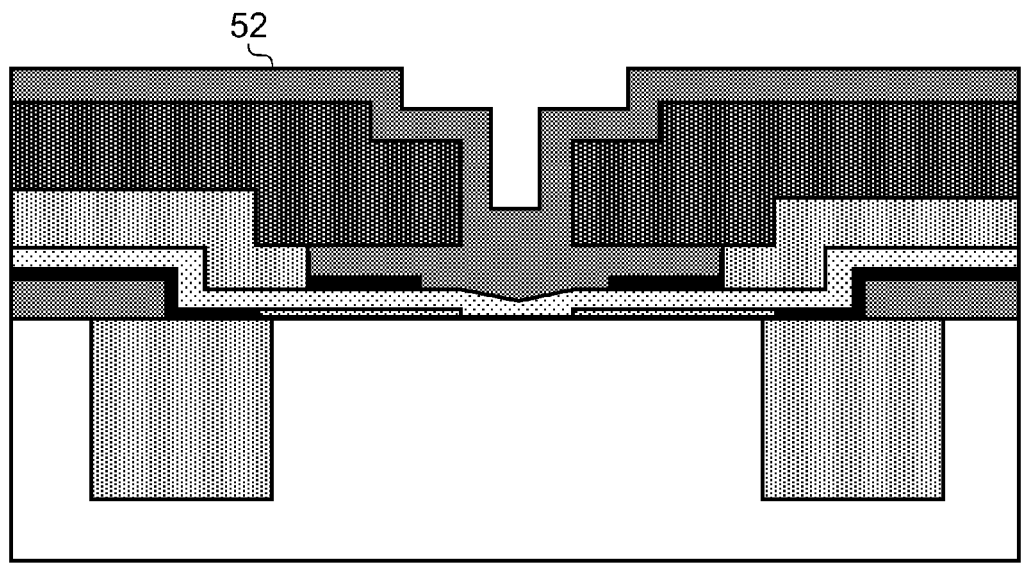
Figure 14:
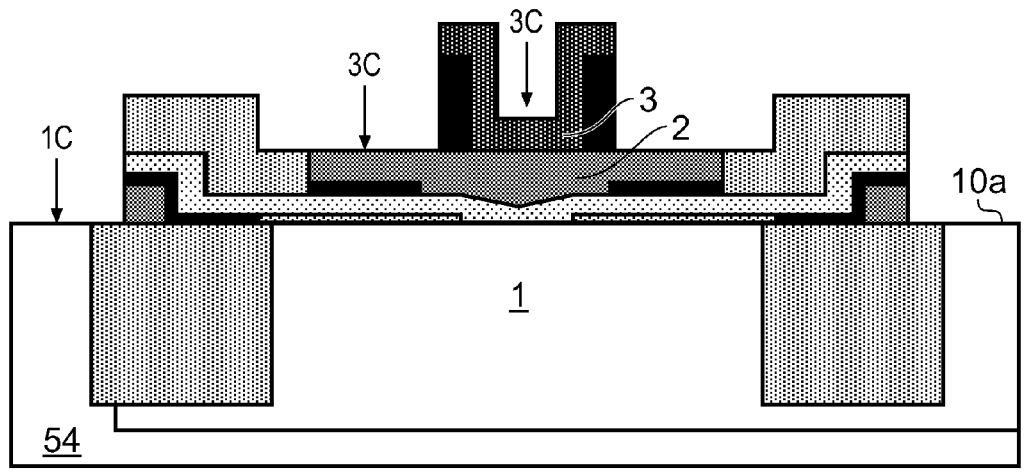

Next, a conformal layer 52 of polysilicon is deposited as shown in FIG. 13. It is doped n-type, for example with As or P atoms at a concentration around 1E20 to 1E21 atoms per $cm^3$. As shown in FIG. 14, polysilicon layer 52 and the underlying nitride layer 24 are then patterned photolithographically to define emitter region 3. Layers 16, 18, 20 and 22 also etched away on either side of the device as shown in FIG. 14 to expose top major surface 10a of the semiconductor body. The collector-base and emitter regions 1, 2, 3 are then provided with connection regions at locations 1C, 2C, 3C in the form of pads of a silicide or a metal such as aluminum for example. The connection from contact at 1C to the collector region 1 is via a so-called sinker region 54 including a buried layer as referred to above.

In a modified version of the above process, a shorter SiGe lateral etch may be carried out in FIG. 5, and the SiGe layer fully removed from the configuration shown in FIG. 14. This may be beneficial where the selectivity of the SiGe etch is not sufficiently high, causing an unwanted degree of etching and silicon at the same time.

FIGS. 15 to 24 illustrate a variation on the above process which uses non-selective epitaxial growth or conformal deposition rather than selective epitaxial growth in the formation of the base region. Initially, the process steps are the same as those described with reference to FIGS. 1 to 8 above.

Figure 15:
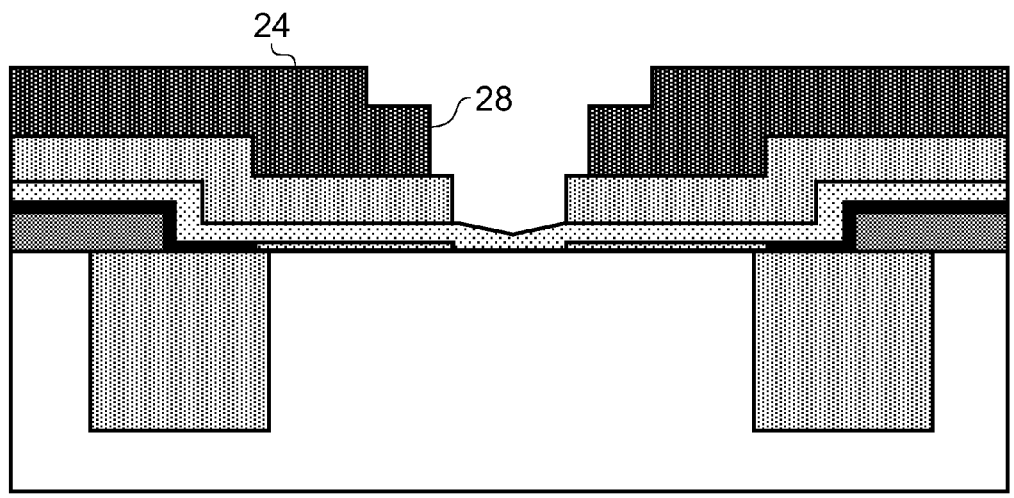
FIGS. 15 to 24 are cross-sectional side views of a semiconductor substrate during successive stages in the fabrication of a bipolar transistor in accordance with a further embodiment of the invention.
Figure 16:
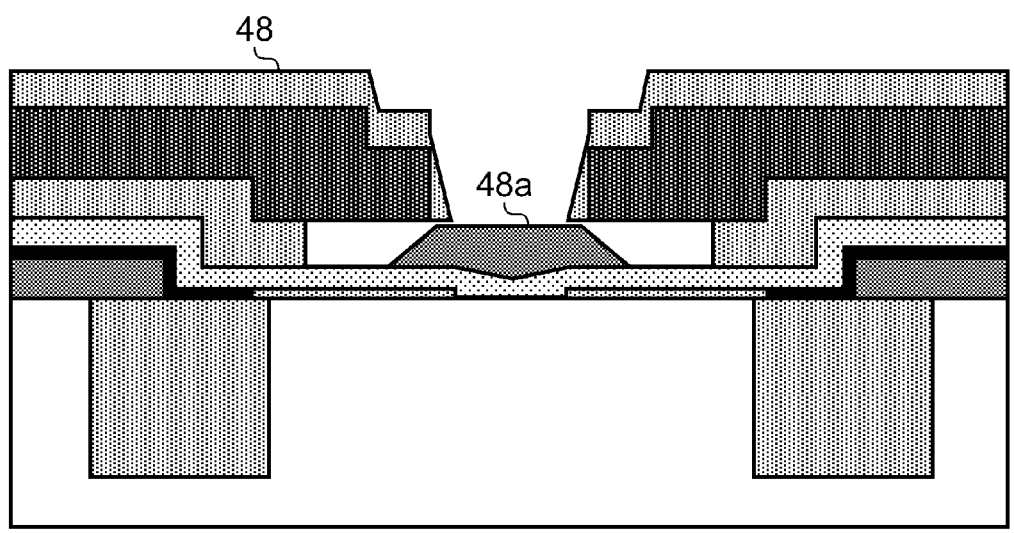

Material is anisotropically etched away from nitride layer 24 to increase the width of trench portion 28, as shown in FIG. 15. Next, a plasma oxide deposition process is carried out similar to that shown in FIG. 10 above to form oxide layer 48 including region 48a on silicon layer 20 (see FIG. 16).

Figure 17:
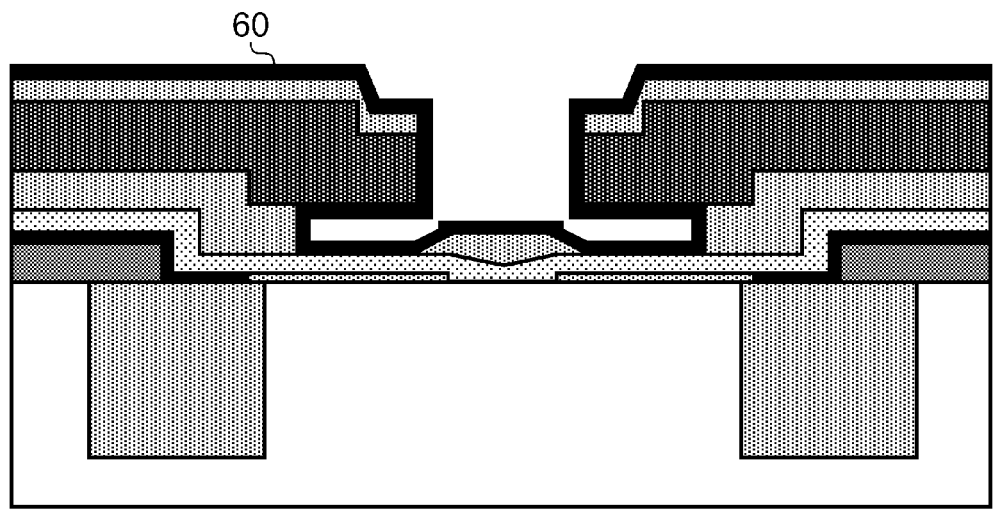
Figure 18:
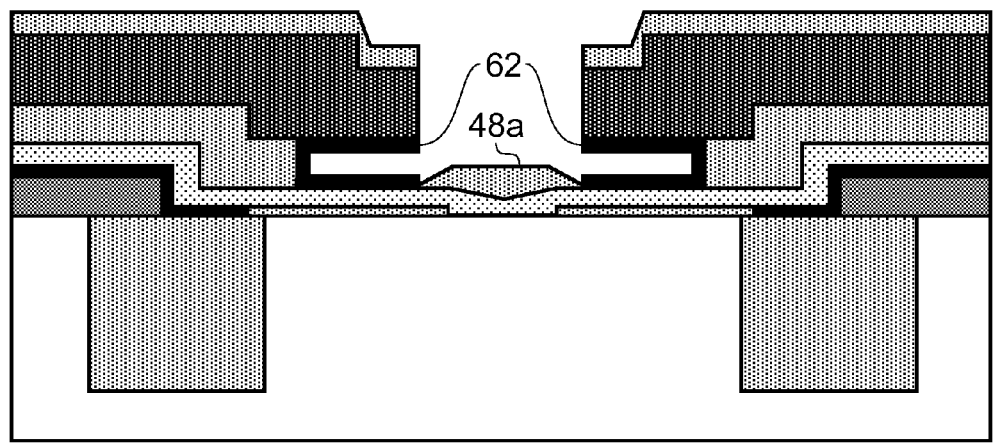

A short anisotropic oxide etch process is then followed by non-selective epitaxial growth or conformal deposition of a layer 60 of Si:B as shown in FIG. 17. An anisotropic etch process stopping on oxide is carried out to leave Si:B regions 62 extending over the walls of the trenches formed beneath nitride layer 24 (see FIG. 18).

Figure 19:
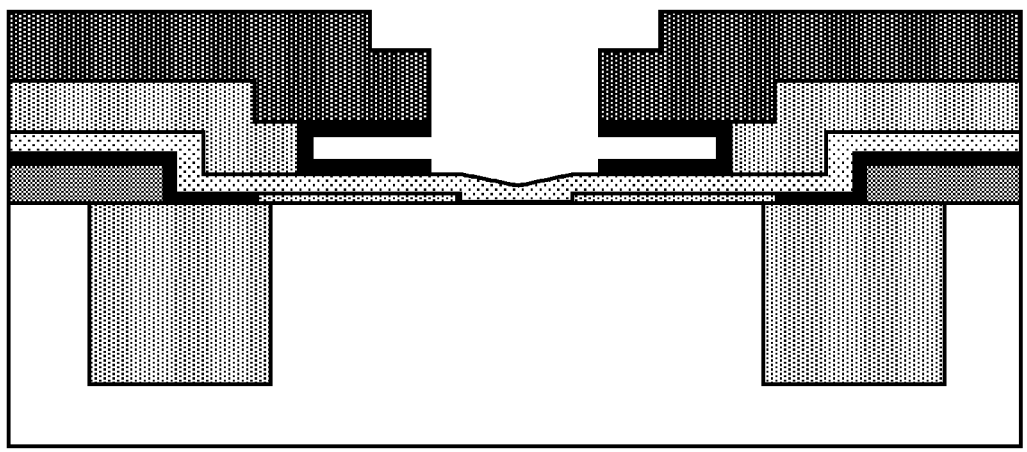
Figure 20:
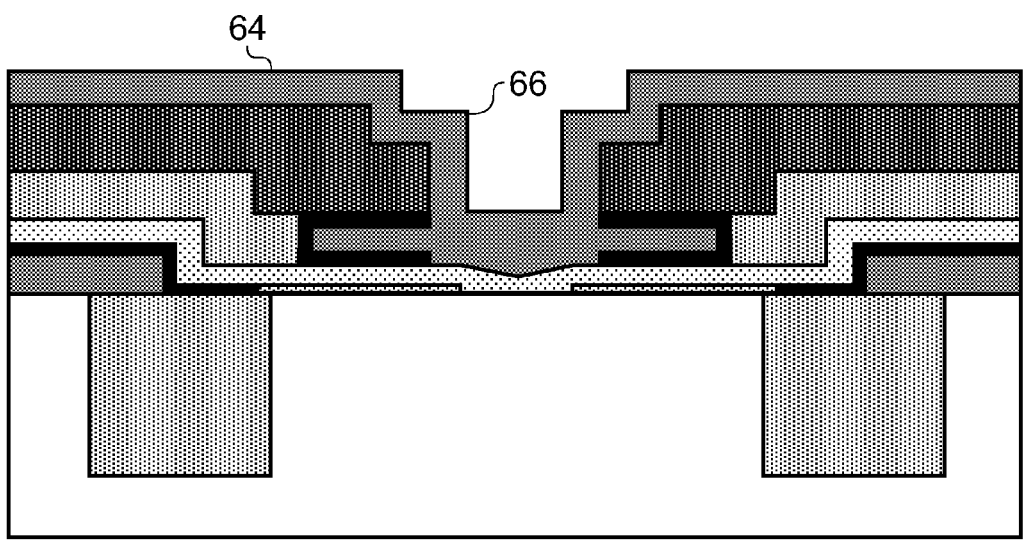
Figure 21:
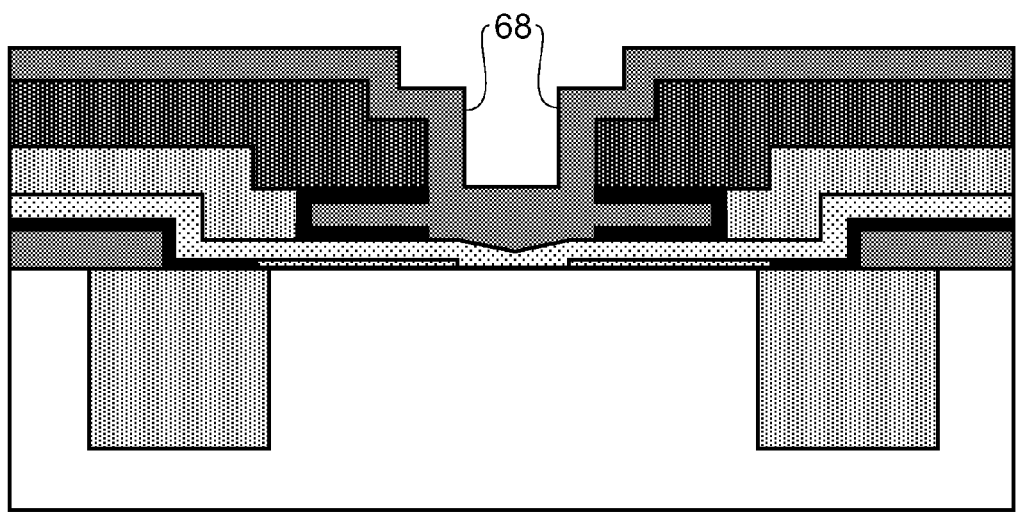

Oxide region 48a is then etched away (see FIG. 19). A layer 64 of semiconductor material is epitaxially grown as shown in FIG. 20, defining a central trench 66. Oxide spacers 68 are formed on the walls of trench 66 as shown in FIG. 21, thereby defining the emitter-base junction at the base of the trench 66 between the spacers 68. Variation of the size of the spacers can be employed to independently adjust the size of the emitter-base junction.

Figure 22:
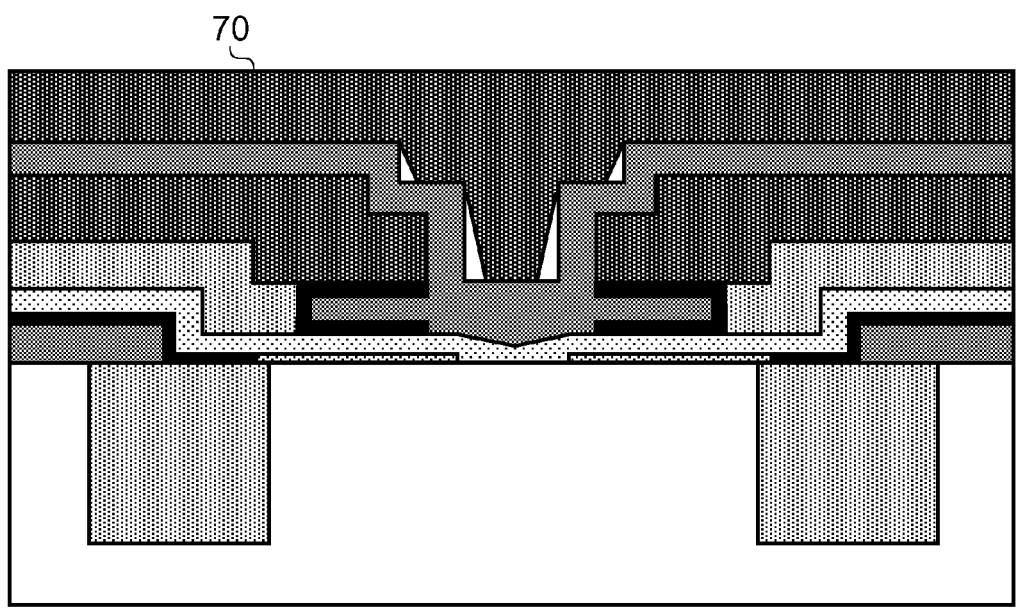
Figure 23:
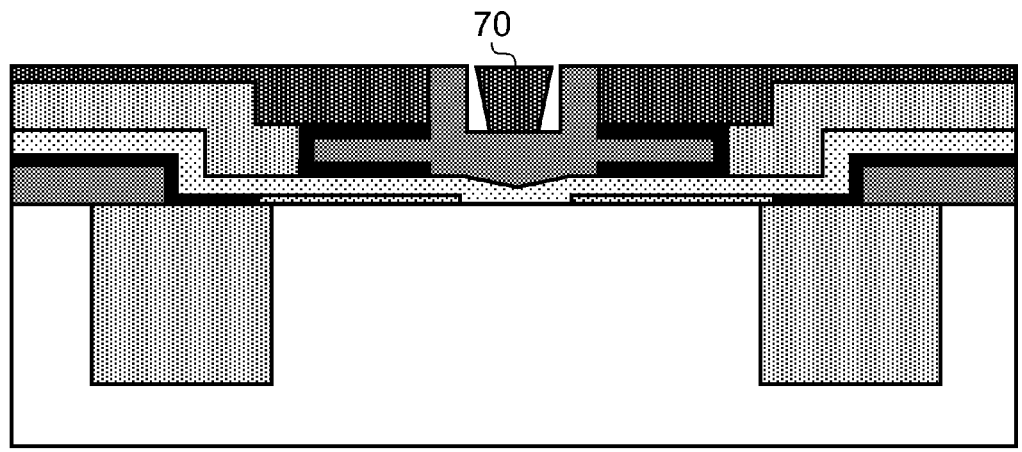

Deposition of polysilicon material 70 is followed by a CMP step stopping on nitride layer 24, as shown in FIGS. 22 and 23.

Figure 24:
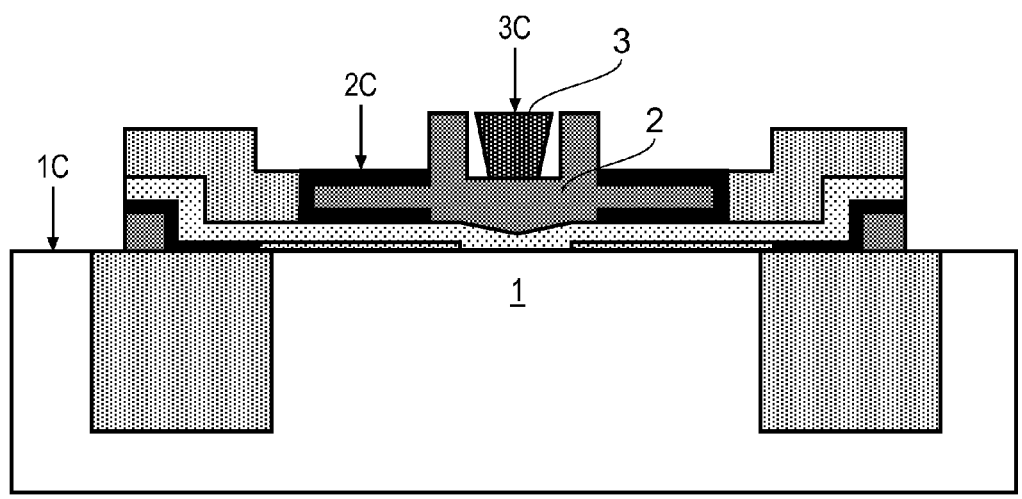

The remaining nitride material is etched away and the remaining layers patterned to form the device configuration shown in FIG. 24.

A further variation of the process is described herein facilitates formation of a semiconductor layer over window definition layer 38 replacing the steps depicted in FIGS. 5 and 6. This variation uses substrate transfer technology to permit formation of a monocrystalline layer on top of an insulating layer. Such techniques are described for example in U.S. Pat. Nos. 7,067,396, 7,060,590 and 7,229,899. They are also discussed in "IC's performance improvement and 3D integration by layer transfer technologies" by Aspar et al, 2006 IEEE International SOI Conference Proceedings, and in "Transfer of patterned Si and SiO$_2$ layers for the fabrication of patterned and mixed SOI" by Moriceau et al in The Proceedings of the 2004 IEEE International SOI Conference. Stages in a suitable process are depicted in FIGS. 25 to 29.

Figure 25:
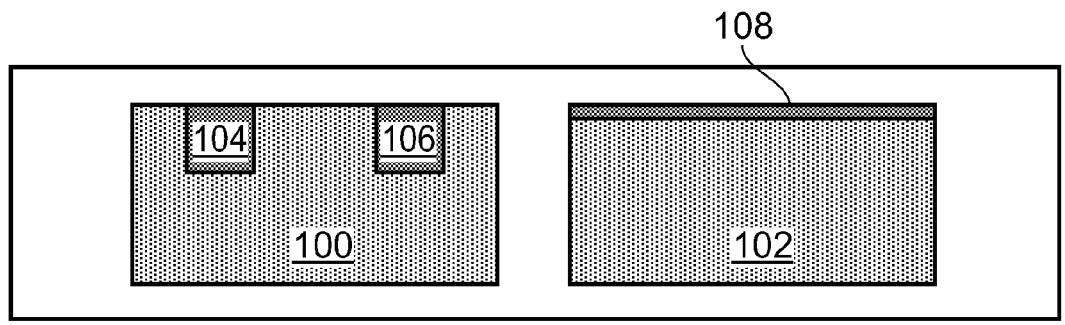
FIGS. 25 to 29 are cross-sectional side views of two semiconductor substrates to illustrate a process variation in accordance with another embodiment of the invention.
Figure 26:
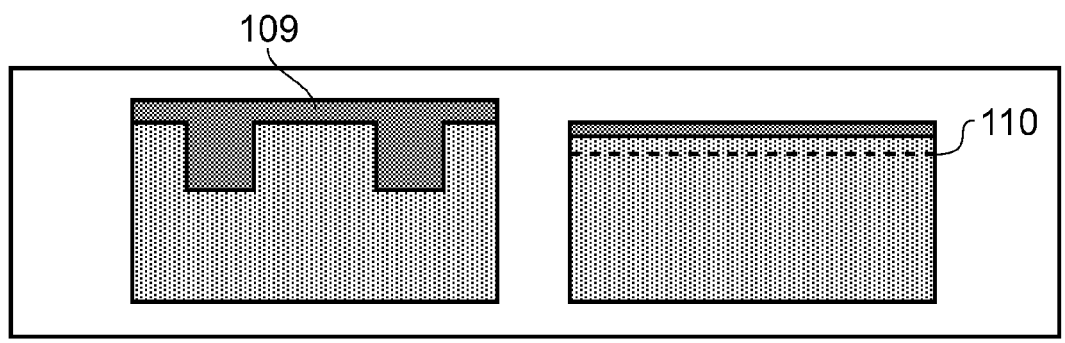

Starting with two silicon substrates 100, 102, STI regions 104, 106 are formed in substrate 100 and the top surface of substrate 102 is oxidized to form oxide layer 108 (see FIG. 25). An oxide layer 109 is then deposited on substrate 100. Ions are implanted into the surface of substrate 102 (hydrogen ions for example) so as to form a layer 110 of microcavities a predetermined distance below the surface of the substrate (see FIG. 26).

Figure 27:
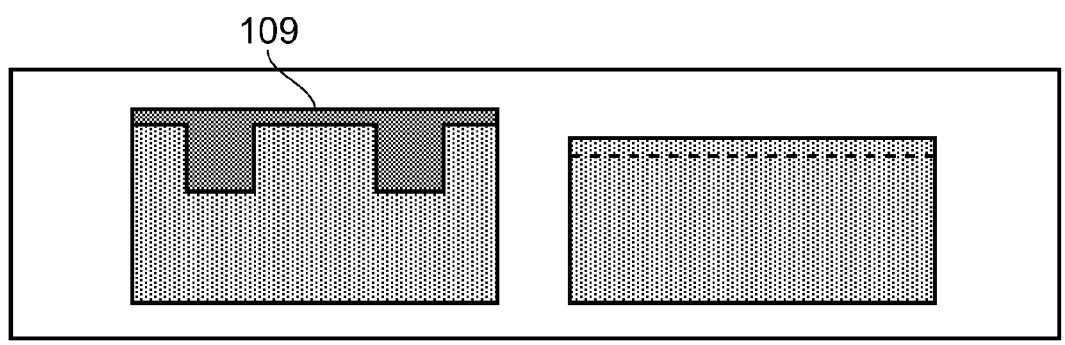
Figure 28:
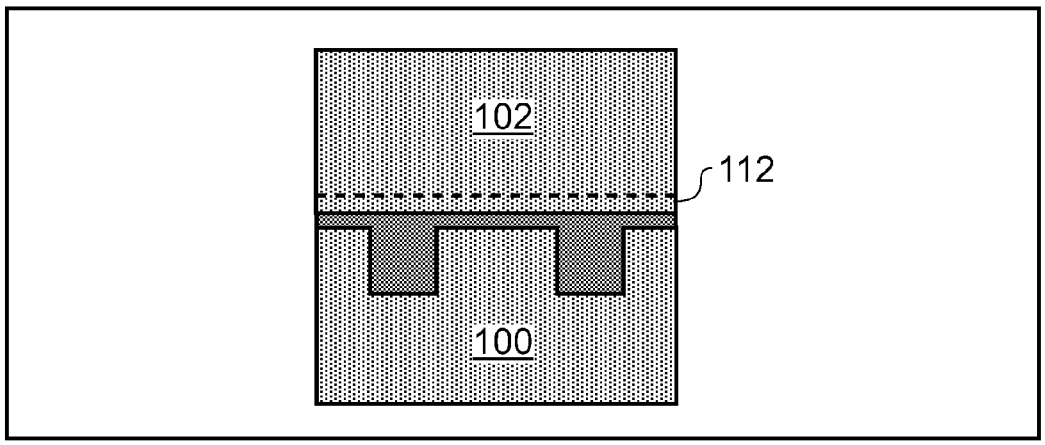
Figure 29:
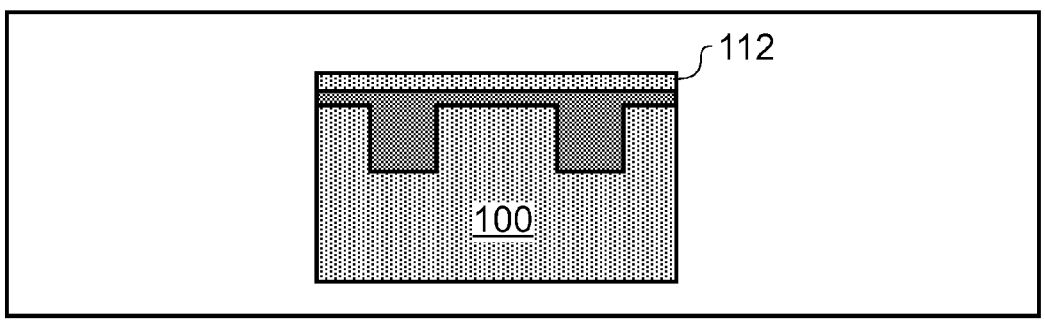

As shown in FIG. 27, the oxide layer on substrate 100 is planarised using CMP, whilst the oxide layer 108 is removed from substrate 102. Substrate 102 is then bonded on to the top surface of substrate 100 as shown in FIG. 28. A thin layer 112 is separated from substrate 102 along the line of the microcavities 110. The resulting structure is then annealed and planarised to result in the configuration shown in FIG. 29, ready for further processing as discussed above in accordance with embodiments of the invention.

Another process embodying the invention will now be described with reference to FIGS. 30 to 34. It involves similar stages of fabrication to the procedures described with reference to FIGS. 1 to 14, except that the stages described with reference to FIGS. 3 to 7 are replaced by the step shown in FIG. 30, and the stages after patterning polysilicon layer 52 and the underlying nitride layer 24 to define the emitter region as described with reference to FIG. 14 are replaced by stages depicted in FIGS. 31 to 34.

Figure 30:
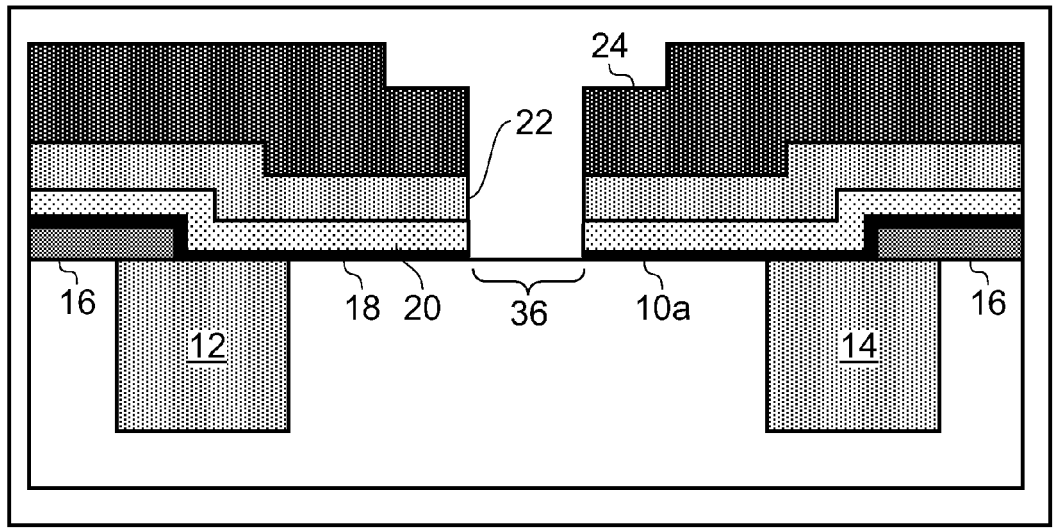
FIGS. 30 to 34 are cross-sectional side views of a semiconductor substrate during stages in the fabrication of a bipolar transistor in accordance with a still further embodiment of the invention.

In the modified trench etch step of FIG. 30, a wider trench than that initially etched in FIG. 3 is etched through all of the layers of stack on the substrate, including window definition layer 18, to expose part of the top major surface 10a of the semiconductor body. This defines window 36 in the window definition layer 18. Processing then continues as described above with reference to FIG. 8 onwards up to FIG. 14.

Figure 31:
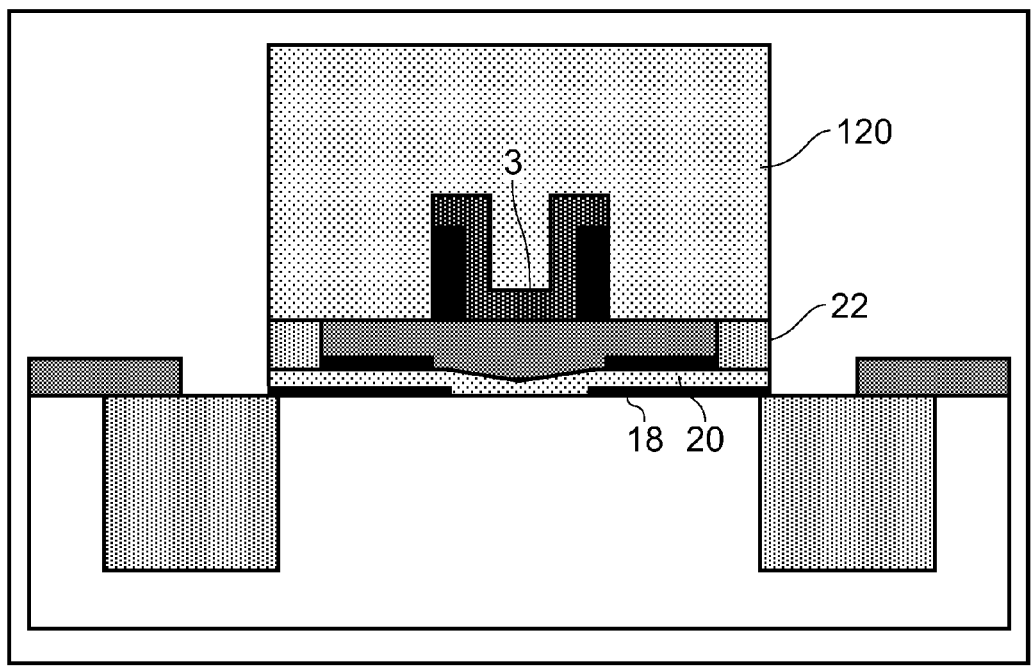

After definition of the emitter region 3 as described with reference to FIG. 14, a photoresistor layer is spun on and then patterned as shown in FIG. 31 to form a mask 120. Layers 18, 20 and 22 of the stack are then anisotropically etched away using mask 120.

Figure 32:
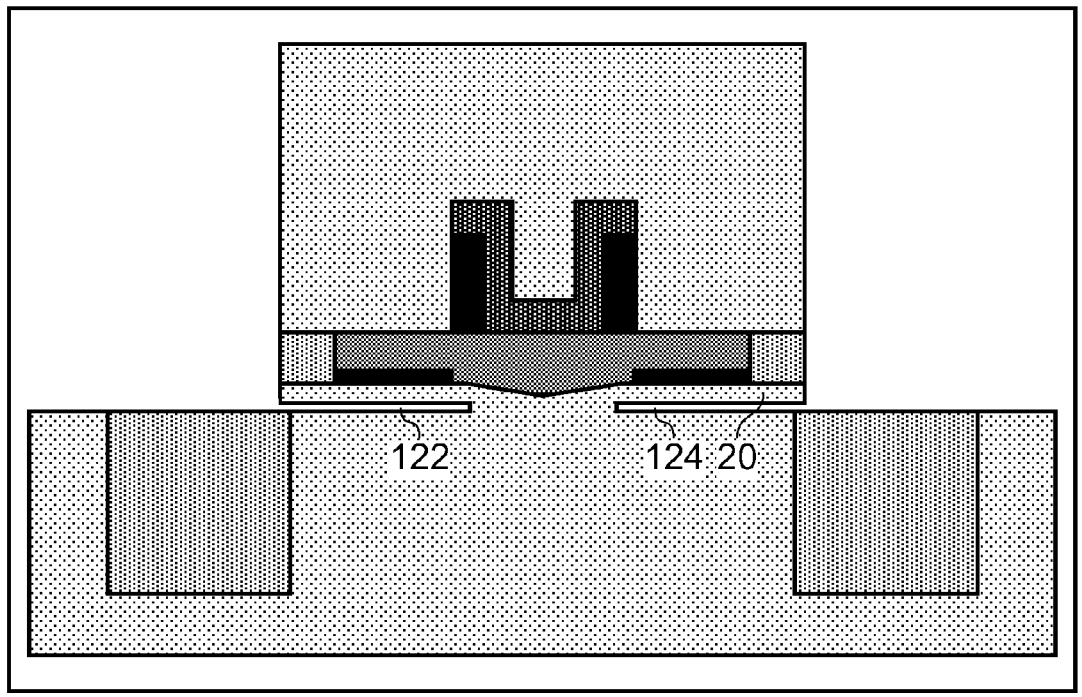

The remainder of SiGe layer 18 is then etched away as shown in FIG. 32, using an etch chemistry as described above with reference to FIG. 5, for example. This forms lateral trenches 122 and 24 beneath semiconductor layer 20.

Figure 33:
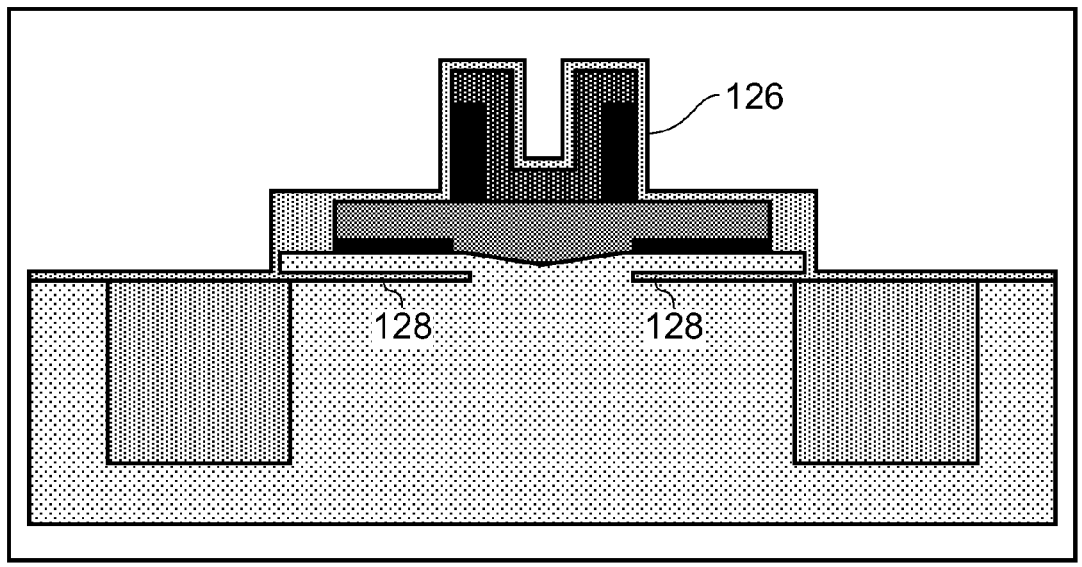
Figure 34:
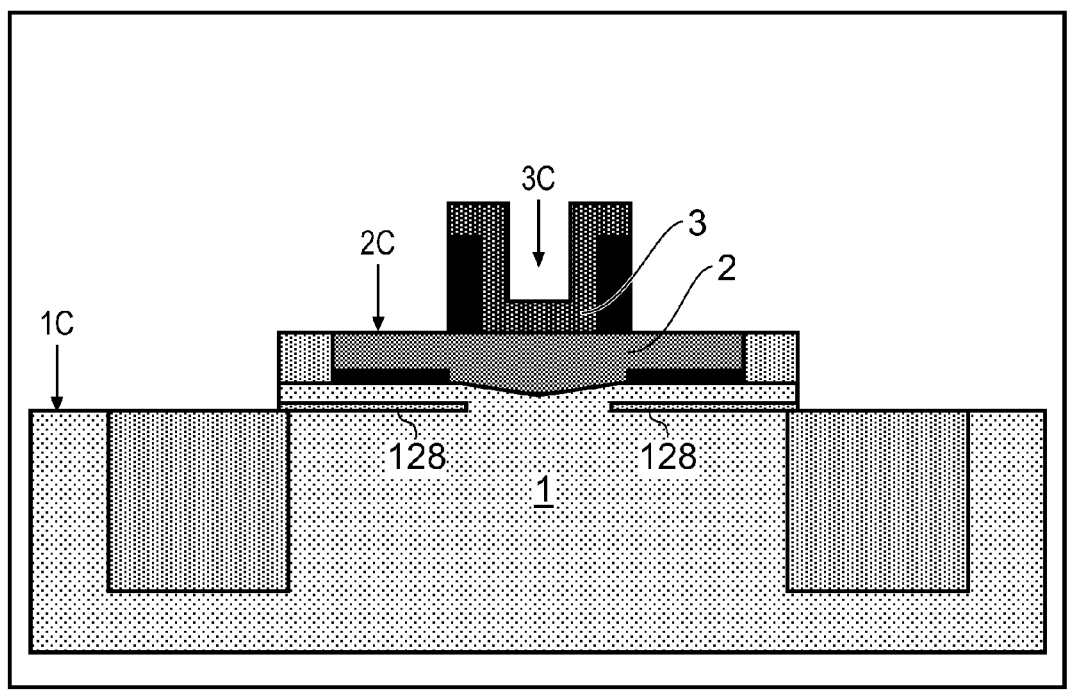

The resist mask 120 is then stripped away, and nitride regions 16 are also removed. Next, a layer 126 of an insulating material such as silicon dioxide is then deposited conformally so as to fill the trenches 122, 124. This effectively reinstates the pattern definition layer under the semiconductor layer 20 in the form of insulating layer 128 as shown in FIG. 33. The remainder of oxide layer 126 is etched away to form the configuration shown in FIG. 34.

It will be appreciated that other variations to the processes described herein will occur to those skilled in the art. For example, device isolation can be achieved in various ways, depending on the required performance and cost. Besides the use of STI regions, junction isolation and full dielectric isolation using SOI substrates may be employed.

Other insulating materials besides those referred to in the examples described above may be employed, such as silicon oxynitride of various compositions. Also, different semiconductor material compositions may be employed.

From reading the present disclosure, other variations and modifications will be apparent to persons skilled in the art. Such variations and modifications may involve equivalent and other features which are already known in the art, and which may be used instead of or in addition to features already described herein.

Although claims have been formulated in this application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The Applicants hereby give notice that new claims may be formulated to such features and/or combinations of such features during the prosecution of the present application or of any further application derived therefrom.

The invention claimed is:

1. A method of manufacturing a bipolar transistor semiconductor device having an emitter region, a base region and a collector region, comprising:
   providing a first semiconductor region of a first conductivity type in a semiconductor body which forms one of the collector and emitter regions;
   forming a stack of layers over the semiconductor body comprising a window definition layer, a layer of semiconductor material of a second, opposite conductivity type, a first insulating layer, and a second insulating layer selectively etchable with respect to the first insulating layer; and
   etching a trench into the stack at least down to the window definition layer, wherein a window is defined in the window definition layer which is aligned with a portion of the trench through the second insulating layer, and defines the base-collector or base-emitter junction in the finished device.

2. A method of claim 1 wherein the window is defined in the window definition layer by trench etching, in which the trench is etched through the window definition layer to form the window.

3. A method of claim 1 comprising after the trench etching, etching so as to widen the portion of the trench which extends through the second insulating layer and form a wider trench portion therethrough, wherein the window is aligned with the wider trench portion.

4. A method of manufacturing a bipolar transistor semiconductor device having an emitter region, a base region and a collector region, comprising:
   providing a first semiconductor region of a first conductivity type in a semiconductor body which forms one of the collector and emitter regions;
   forming a stack of layers over the semiconductor body comprising a window definition layer, a layer of semiconductor material of a second, opposite conductivity type, a first insulating layer, and a second insulating layer selectively etchable with respect to the first insulating layer;
   etching a trench into the stack at least down to the window definition layer, wherein a window is defined in the window definition layer which is aligned with the trench portion through the second insulating layer, and defines the base-collector or base-emitter junction in the finished device; and
   annealing such that material from the layer of semiconductor material is reshaped so as to extend into the window.

5. A method of claim 1 comprising depositing semiconductor material in the window.

6. A method of claim 1 comprising:
   etching the first insulating layer back from the trench; and
   depositing a non-conformal layer of insulating material which is selectively etchable with respect to the second insulating layer to form an aligned region of insulating material on the layer of semiconductor material which is aligned with the wider trench portion.

7. A method of claim 6 comprising selectively epitaxially growing semiconductor material on the areas of the layer of semiconductor material which are exposed on either side of the aligned region of insulating material to form the base region of the device.

8. A method of claim 6 comprising non-selectively epitaxially growing semiconductor material over the exposed surfaces of the device.

9. A method of claim 1 comprising depositing semiconductor material of the first conductivity type in the trench portion through the second insulating layer so as to contact the base region, with the location of the emitter-base or collector-base junction respectively being dependent on the location and width of the trench portion.

10. A method of claim 1, wherein the window definition layer is formed of epitaxially deposited semiconductor material, the layer of semiconductor material is epitaxially deposited thereon, with the material of the window definition layer being selectively etchable with respect to the layer of semiconductor material, and defining a window in the window definition layer comprising:
    etching back the window definition layer from the walls of the trench;
    conformally depositing window definition insulating material etchable simultaneously with the material of the first insulating layer; and
    anisotropically etching away the window definition insulating material and material of the first insulating layer using the second insulating layer as a mask, so as to form the window in the window definition layer.

11. A method of claim 1, wherein the window definition layer is formed of epitaxially deposited semiconductor material, the layer of semiconductor material is epitaxially deposited thereon, with the material of the window definition layer being selectively etchable with respect to the layer of semiconductor material, and defining a window in the window definition layer comprising:
    patterning the stack of layers so as to expose outer edges of the window definition layer;
    etching away the remainder of the window definition layer; and
    depositing window definition insulating material to replace the window definition layer such that the window is defined by the window definition insulating material layer.

12. A method of claim 1, wherein the window definition layer is formed of insulating material, and the layer of semiconductor material is provided thereover by bonding a separate semiconductor substrate onto the insulating layer, and separating the layer of semiconductor material from the remainder of the separate semiconductor substrate.

13. A semiconductor device obtained by a method of claim 1.

14. A semiconductor device of claim 13, wherein the window definition layer is formed of insulating material, and the layer of semiconductor material is substantially monocrystalline and extends over the window definition layer and through the window to contact the collector or emitter region in the semiconductor body.

15. An integrated circuit including a semiconductor device of claim 13.

* * * * *